(12) United States Patent
Dokumaci et al.

(10) Patent No.: US 6,531,365 B2
(45) Date of Patent: Mar. 11, 2003

(54) ANTI-SPACER STRUCTURE FOR SELF-ALIGNED INDEPENDENT GATE IMPLANTATION

(75) Inventors: Omer H. Dokumaci, Wappingers Falls, NY (US); Bruce B. Doris, Brewster, NY (US); Peter Smeys, White Plains, NY (US); Isabel Y. Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/888,160

(22) Filed: Jun. 22, 2001

(65) Prior Publication Data

US 2002/0197839 A1 Dec. 26, 2002

(51) Int. Cl.⁷ .................. H01L 21/336; H01L 21/8238; H01L 21/8236; H01L 21/425; H01L 21/44
(52) U.S. Cl. .................. 438/296; 438/232; 438/276; 438/303; 438/532; 438/659
(58) Field of Search ................. 438/232, 659, 438/296, 303, 229, 532, 276, 278, 275, 277

(56) References Cited

U.S. PATENT DOCUMENTS

| | | | |
|---|---|---|---|
| 4,502,202 A | | 3/1985 | Malhi |
| 4,555,843 A | | 12/1985 | Malhi |
| 4,564,584 A | * | 1/1986 | Fredericks et al. ......... 430/312 |
| 4,728,617 A | | 3/1988 | Woo et al. |
| 4,745,086 A | | 5/1988 | Parrillo et al. |
| 5,453,389 A | | 9/1995 | Strain et al. |
| 5,472,898 A | * | 12/1995 | Hong et al. ................. 438/278 |
| 5,536,669 A | * | 7/1996 | Su et al. ..................... 438/276 |
| 5,665,621 A | * | 9/1997 | Hong ......................... 438/278 |
| 5,731,239 A | | 3/1998 | Wong et al. |
| 5,828,102 A | | 10/1998 | Bergemont |
| 5,856,225 A | | 1/1999 | Lee et al. |
| 5,893,739 A | | 4/1999 | Kadosh et al. |
| 6,008,096 A | | 12/1999 | Gardner et al. |
| 6,060,345 A | * | 5/2000 | Hause et al. ................. 438/199 |
| 6,060,358 A | | 5/2000 | Bracchitta et al. |
| 6,117,715 A | * | 9/2000 | Ha ............................. 438/197 |
| 6,133,102 A | * | 10/2000 | Wu ............................. 438/276 |
| 6,156,598 A | * | 12/2000 | Zhou et al. ................. 438/231 |
| 6,239,008 B1 | * | 5/2001 | Yu et al. ..................... 438/587 |
| 6,251,731 B1 | * | 6/2001 | Wu ............................. 438/275 |
| 6,258,677 B1 | * | 7/2001 | Ang et al. ................... 438/300 |
| 6,277,683 B1 | * | 8/2001 | Pradeep et al. ............. 438/200 |
| 6,291,278 B1 | * | 9/2001 | Xiang et al. ................ 438/197 |
| 6,365,523 B1 | | 4/2002 | Jang et al. ................... 438/692 |
| 6,368,988 B1 | | 4/2002 | Li et al. ...................... 438/792 |
| 6,410,403 B1 | | 6/2002 | Wu ............................. 438/424 |

FOREIGN PATENT DOCUMENTS

| | | | |
|---|---|---|---|
| JP | 0484128 A1 | * | 5/1992 |
| JP | 406204213 A | * | 7/1994 |
| JP | 406349765 A | * | 12/1994 |

* cited by examiner

*Primary Examiner*—Matthew Smith
*Assistant Examiner*—Choung A Luu
(74) *Attorney, Agent, or Firm*—Scully, Scott, Murphy & Presser; Margaret A. Pepper, Esq.

(57) ABSTRACT

A method for improving the gate activation of metal oxide semiconductor field effect transistor (MOSFET) structures are provided. The method of the present invention includes the steps of forming a plurality of patterned gate stacks atop a layer of gate dielectric material; forming a first planarizing organic film on the gate dielectric material and abutting vertical sidewalls of the patterned gate stacks, said planarizing organic film not being present on top, horizontal surfaces of each of the patterned gate stacks; blocking some of the plurality of patterned gate stacks with a first resist, while leaving other patterned gate stacks of said plurality unblocked; implanting first ions into the unblocked patterned gate stacks; removing the first resist and first planarizing organic film and forming a second planarizing organic film and blocking the previously unblocked patterned gate stacks with a second resist; implanting second ions into the patterned gate stacks that are not blocked by said second resist; and removing the second resist and the second planarizing organic film.

24 Claims, 3 Drawing Sheets

ANTI-SPACER STRUCTURE FOR SELF-ALIGNED INDEPENDENT GATE IMPLANTATION

RELATED APPLICATIONS

This application is related to Ser. No. 09/882,250 which is being concurrently filed with the present application.

DESCRIPTION

Field of the Invention

The present invention relates to semiconductor device manufacturing, and more particularly to a method of fabricating a metal oxide semiconductor field effect transistor (MOSFET) in which the gate and source/drain regions are independently doped in a self-aligned manner after the gate stack has been etched. The method of the present invention does not affect line width control, and no additional lithography steps are required.

BACKGROUND OF THE INVENTION

In today's most advanced semiconductor devices, the gate implant is also received by the source/drain regions. Typically, the maximum amount of dopant that the gate can receive is limited by the amount that the source/drain regions can tolerate. For example, current state-of-the-art NFETs use phosphorus for the source/drain regions. If too much phosphorus is implanted into the source/drain regions, then lateral phosphorus diffusion may be excessive causing degraded short channel effects. On the contrary, implanting high doses of phosphorus (on the order of about 5E15 cm$^{-2}$ or greater) into the gate reduces the gate depletion effect and improves the device characteristics.

In some prior art processes, wider source/drain spacers are used to accommodate a higher dose of phosphorus into the source/drain regions. However, this causes the series resistance of the transistor to significantly increase.

If arsenic is used for the source/drain doping, achieving comparable gate activation as phosphorus is difficult for the same thermal cycle. In order to achieve maximum flexibility in achieving the least poly depletion and best short channel effect control, independent doping of the source/drain regions and the gate regions is desirable.

It would thus be beneficial if a method would be developed that was capable of independent doping of the gate region and the source/drain regions. Such a method would achieve improvements in the gate region of the device without negatively impacting the source/drain regions of the device.

One possible prior art approach for independent doping of the gate and the source/drain regions includes the use of a so-called gate predoping scheme. A typical gate predoping scheme of the prior art includes the steps of:

(i) depositing polysilicon onto a surface of a gate dielectric which is formed atop a semiconductor substrate;

(ii) using a first lithographic step to block the PFET region;

(iii) implanting ions into the NFET polysilicon material;

(iv) stripping the resist employed in step (ii);

(v) using a second lithographic step to block the NFET region;

(vi) implanting ions into the PFET polysilicon material;

(vii) stripping of the resist; and (viii) etching the gate stack region.

In this prior art process, an activation annealing step is typically performed between steps (vii) and (viii) mentioned above.

A major disadvantage of this prior art integration scheme is that the implants are performed before the gate stack has been etched. This leads to poor line width control since the P-type polysilicon will etch differently than the N-type polysilicon. Also, if the implant condition is changed, the gate etch steps needs to be re-optimized again since a different doping in the gate region will change the etch characteristics. Another major disadvantage of the aforementioned prior art gate predoping scheme is that it requires two additional lithography steps, e.g., steps (ii) and (v) mentioned-above, prior to etching of the gate region. A yet further disadvantage of this prior art process is that the different etching rates may results in recessing a portion of the substrate.

In view of the above drawbacks with prior art methods, there is a continued need for providing a method which is capable of independent doping of the gate and the source/drain regions that will allow for optimizing the doping in the gate and source/drain regions independently so that improved device characteristics can be achieved without the compromise between gate depletion and series resistance.

SUMMARY OF THE INVENTION

One object of the present invention is to provide a method of fabricating a MOSFET device which is capable of independent doping of the gate and the source/drain regions.

A further object of the present invention is to provide a method of fabricating a MOSFET device which has reduced gate depletion, improved device characteristics and limited lateral diffusion of dopant in the source/drain regions and the source/drain extension regions.

Another object of the present invention is to provide a method of fabricating a MOSFET device which has improved series resistance and line width control.

A yet further object of the present invention is to provide a method of fabricating a MOSFET device in which gate predoping is avoided and the number of lithographic steps is reduced.

These and other objects and advantages are achieved in the present invention by applying a planarizing organic film to a semiconductor structure after the gate regions have been etched. Since the film is planarizing, the source/drain diffusion regions as well as the source/drain extension regions are covered with a thick amount of film, while the gate region is covered with a very thin amount of the material. A particular attractive choice for the planarizing film is an antireflective coating such as AR7 or DUV 30, each sold by Brewer Scientific, LTD.

With the proper film thickness and ion implantation conditions, along with a possible reactive-ion etch back to completely clear the top horizontal surface of each gate region, the gate regions may be implanted while the source/drain extension regions and source/drain diffusion regions are being protected from the implant.

One aspect of the present invention thus relates to a method of fabricating a MOSFET device which comprises the steps of:

(a) forming a plurality of patterned gate stacks atop a layer of gate dielectric material;

(b) forming a first planarizing organic film on said gate dielectric material and abutting vertical sidewalls of said patterned gate stacks, said planarizing organic film not being present on top, horizontal surfaces of each of said patterned gate stacks;

(c) blocking some of the plurality of patterned gate stacks with a first resist, while leaving other patterned gate stacks of said plurality unblocked;

(d) implanting first ions into said unblocked patterned gate stacks;

(e) removing said first resist and said first planarizing organic film, applying a second planarizing film and blocking said previously unblocked patterned gate stacks with a second resist;

(f) implanting second ions into said patterned gate stacks that are not blocked by said second resist; and (g) removing said second resist and said second planarizing organic film.

In one embodiment of the present invention, the planarizing organic film of step (b) is formed on exposed surfaces of a semiconductor structure which do not contain a patterned gate region, i.e., patterned gate stack formed atop a patterned gate dielectric.

Note that source/drain regions and source/drain extension regions may be formed prior to performing step (b) above, after step (d) and step (f), or after step (g). When the source/drain regions and source/drain extensions are formed, it may be necessary to form sidewall spacers on the vertical sidewalls of each patterned gate stack region. In one preferred embodiment of the present invention, source/drain regions and/or source/drain extension regions are implanted after steps (d) or (f). Before the implants, the planarizing film is selectively etched with respect to the resist, gate and substrate.

In the present invention, the first ions employed in step (d) may be the same or different from the second ions employed in step (f). In a preferred embodiment of the present invention, the first ions are different from the second ions. Note that in some embodiments, the ions used in steps (d) and (f) are the same, but different ion dosages are employed in each step so as to form doped gate regions having different ion concentrations.

DETAILED DESCRIPTION OF THE INVENTION

Figure 1:
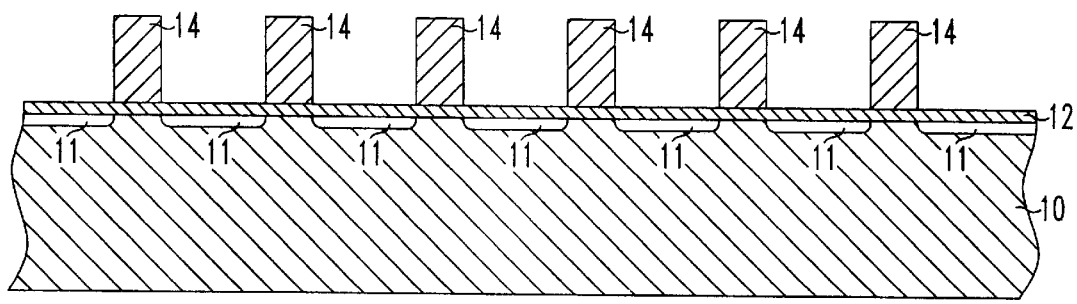
FIGS. 1–7 are pictorial representations (through cross-sectional views) showing the basic processing steps of the present invention.

The present invention, which provides a method of fabricating a MOSFET device in which independent doping of the gate and source/drain regions and source/drain extensions is achieved, will now be described in greater detail by referring to the drawings that accompany the present application. It is noted that in the accompanying drawings like and/or corresponding elements are referred to by like reference numerals.

Reference is first made to FIG. 1 which illustrates an initial structure that is employed in the present invention. Specifically, the initial structure shown in FIG. 1 comprises semiconductor substrate 10, a layer of gate dielectric 12 formed on a surface of semiconductor substrate 10, and a plurality of patterned gate stacks 14 formed on portions of gate dielectric 12.

The structure shown in FIG. 1 is comprised of conventional materials well know in the art and it is fabricated utilizing processing steps that are also well known in the art.

For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting material, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions or other like regions that are typically present in MOSFET-containing devices. For clarity, these regions are not shown in the drawings, but are nevertheless meant to be included within region 10. In one highly preferred embodiment of the present invention, semiconductor substrate 10 is comprised of Si.

Next, a layer of gate dielectric material such as an oxide, nitride, oxynitride or any combination and multilayers thereof, is then formed on a surface of semiconductor substrate 10 utilizing a conventional process well known in the art. For example, the layer of gate dielectric material may be formed by utilizing a conventional deposition process such as chemical vapor deposition (CVD), plasma-assisted CVD, evaporation or chemical solution deposition, or alternatively, the gate dielectric material may be formed by a thermal growing process such as oxidation, nitridation or oxynitridation.

The thickness of the layer of gate dielectric material formed at this point of the present invention is not critical to the present invention, but typically, gate dielectric 12 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric 12 is comprised of an oxide such as $SiO_2$, $ZrO_2$, $HfO_2$, $Ta_2O_5$ or $Al_3$.

After forming gate dielectric 12 on a surface of semiconductor substrate 10, a plurality of patterned gate regions 14 are formed atop the layer of gate dielectric. The patterned gate regions are formed utilizing a conventional process which includes the steps of: depositing at least a gate material, and patterning said gate material via lithography and etching. The lithography step includes applying a photoresist to the gate material, exposing the photoresist to a pattern of radiation and developing the pattern utilizing a conventional developer solution. Etching is performed utilizing a conventional dry etching process such as reactive-ion etching, plasma etching, ion beam etching or laser ablation. Following the etching process, the photoresist is removed from the structure utilizing a conventional stripping process well known in the art so as to provide the structure shown, for example, in FIG. 1.

In one embodiment of the present invention, the photoresist is not stripped until after the gate dielectric has been etched. This provides an initial structure having exposed surfaces of semiconductor substrate 10 and patterned regions that include patterned gate regions formed atop patterned gate dielectric.

It is noted that each of patterned gate regions 14 shown in FIG. 1 includes at least a gate material which may further contain an optional dielectric capping layer formed thereon. The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of said elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of gate dielectric 12 utilizing conventional deposition processes well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing so as to form a metal silicide layer therefrom, and removing any unreacted elemental metal utilizing a conventional wet etch process that has a high selectivity for removing unreacted metal as compared to silicide.

It is noted that in embodiments wherein a gate stack is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, an optional dielectric capping layer may be present atop the gate material. When present, the optional dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming the optional dielectric capping layer.

In one embodiment of the present invention, source/drain diffusion regions 11 and source/drain extensions (note that the source/drain extensions are not shown separately in the drawings; instead they are meant to be included within region 11) may be formed in the semiconductor substrate at this point of the present invention. Typically, the source/drain extensions are formed prior to the source/drain regions utilizing conventional ion implantation and annealing processes well known in the art. In such an embodiment, sidewall spacers (not shown) would be formed on the vertical sidewalls of each patterned gate region utilizing deposition and etching processes well known in the art.

In other embodiments, the source/drain diffusion regions and/or source/drain extension regions may be formed after implanting into each gate region or following implantation into both gate regions. A gate activation anneal, as mentioned hereinbelow, may follow the implantation into the gate region. Note that in FIG. 1 the source/drain diffusion regions and source/drain extensions are shown therein.

In yet another embodiment of the present invention, the patterned gate stack is subjected to a conventional reoxidation process prior to forming the planarizing organic film on the structure.

Figure 2:
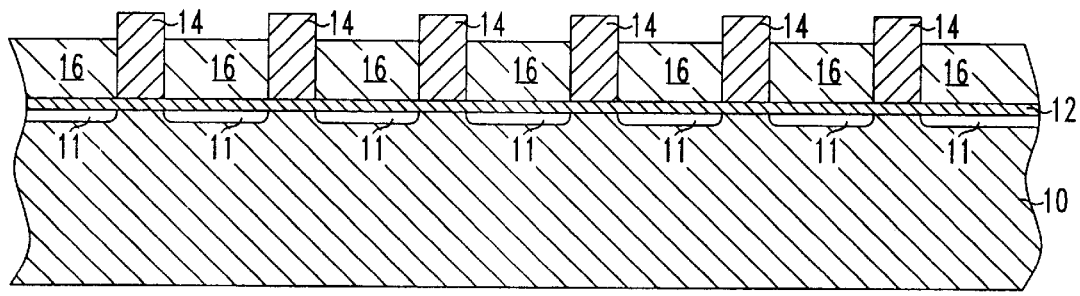

After providing the structure shown in FIG. 1, planarizing organic film 16 is formed across the entire surface of the structure including atop gate dielectric 12 as well as portions of patterned gate regions 14 (note that at least portions of vertical sidewalls of the patterned gate regions contain the planarizing organic film; the top horizontal portions of the patterned gate stacks need not be covered with the planarizing organic film). The resultant structure is shown, for example, in FIG. 2. In the embodiment wherein patterned gate dielectric layers are employed, the planarizing organic film is formed atop the exposed surfaces of the substrate as well as portions of the patterned regions.

The planarizing organic film is formed in the present invention utilizing any deposition process that is capable of forming such a layer on a structure. For example, CVD, plasma-assisted CVD, evaporation, chemical solution deposition or spin-on coating may be employed in forming the planarizing organic film on the structure containing the patterned gate regions. If needed, the deposited planarizing organic film may be baked at a temperature which is capable of removing any residual solvent from the film. When a baking step is employed, the baking step is typically carried out at a temperature of from about 150° to about 250° C. It is noted that the baking temperatures are dependent on the type of planarizing organic film that is employed, thus the baking conditions may vary somewhat for those mentioned herein.

The above steps of deposition and baking may be repeated any number of times, as required. It is noted that multiple coatings with bakes in between each coating provides a more planar film and it also allows the film to be applied to any desired thickness. The total thickness of the planarizing organic film that is formed at this point of the present invention is dependent on the height of the gate region. Typically, the planarizing organic film has a height of from about ½ to about 3 times the height of the gate region, with a thickness of from about 200 to about 500 Å taller than the height of the gate region being more preferred.

The planarizing organic film that is employed in the present invention includes an organic polymer or mixtures thereof that is not sensitive to subsequent exposure steps. Illustrative examples of suitable planarizing organic films that can be employed in the present invention include, but are not limited to: antireflective coatings, polyimide or another organic polymers that do not image during a subsequent imaging process. Of these planarizing organic films, it is highly preferred to use antireflective coatings such as AR3 and DUV 30 (each sold by Brewers Science, LTD) as the planarizing organic film.

In some embodiments wherein the planarizing organic film is formed completely atop the top horizontal surfaces of each patterned gate stack region, the planarizing organic film may be subjected to a conventional etch back process so as to remove the planarizing organic film from the top horizontal surface of each of the patterned gate stack regions. Examples of possible etch back processes that can be employed in the present invention include, but are not limited to: a reactive-ion etch back process or a chemical wet etch process wherein an etchant that has a high selectivity for removing planarizing organic film as compared to gate material can be employed.

In one embodiment of the present invention, an optional liner film may be formed on the structure prior to formation of the planarizing organic film. The optional liner film (not shown in the drawings) is comprised of a dielectric material such as $Si_3N_4$ or $SiO_2$. Note that the liner film assists in the selective removal of the planarizing organic film.

Figure 3:
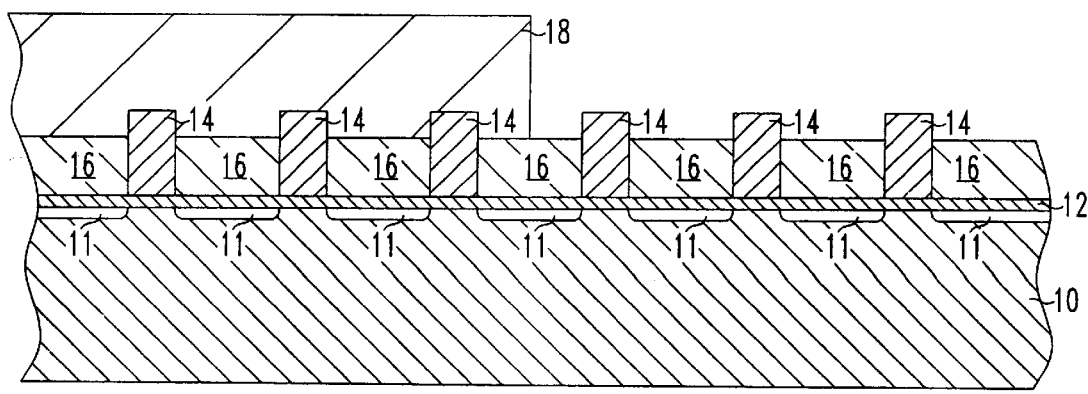

FIG. 3 shows the structure that is obtained after some of patterned gate stacks 14 are blocked with first resist 18, while leaving other patterned gate stacks unblocked. Specifically, the structure shown in FIG. 3 is formed utilizing conventional lithography which includes the steps of: applying a layer of first resist 18, exposing the layer of first resist to a pattern of radiation and developing the pattern utilizing a conventional resist developer.

In one embodiment of the present invention, blocking of the gates by the resist is omitted in the case wherein one type of device is being formed.

Figure 4:
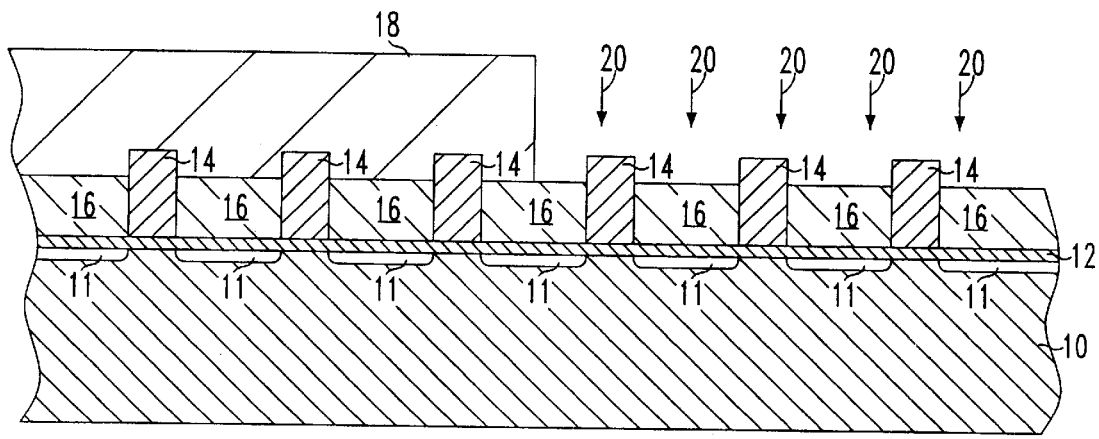

With first resist 18 in place, the unblocked patterned gate stacks are then subjected to an ion implantation step which is capable of implanting ions into the exposed gate regions that are not blocked with first resist 18. In accordance with the present invention, this ion implantation step includes the use of an ion implant wherein an ion of a first conductivity type (N or P) or neutral is implanted into the gate material. The ion dose used in this implant step of the present invention may vary, but typically an ion dose of about 5E15 $cm^{-2}$ or greater is employed. This step of the present invention, i.e., the ion implantation step, is shown in FIG. 4. Note that in the drawing reference numeral 20 is used to denote the first ions that are being implanted within the gate material.

It is noted that the ions implanted at this step of the present invention are not implanted into the substrate due to the presence of the thicker horizontal portions of planarizing organic film 16. Instead, the ions are implanted into the gate region through the exposed top horizontal surface of each patterned gate stack region.

In an optional embodiment of the present invention, the gate material is preamorphized prior to implanting ions of the first ions into the gate material. When preamorphization occurs an ion such as Ge or Si is implanted into the gate material. The preamorphization step is employed in the present invention to prevent channeling of the first ions into the channel region of the device.

In some embodiments of the present invention, the unblocked planarizing organic film shown in FIG. 4 may be removed at this point of the inventive method and source/drain extension regions and/or source/drain diffusion regions 11, if spacers are present, may be implanted into the surface of substrate 10 as described hereinabove. This embodiment is not shown in the drawings since the source/drain extension regions and/or source/drain diffusion regions have been previously formed into the surface of substrate 10.

Figure 5:
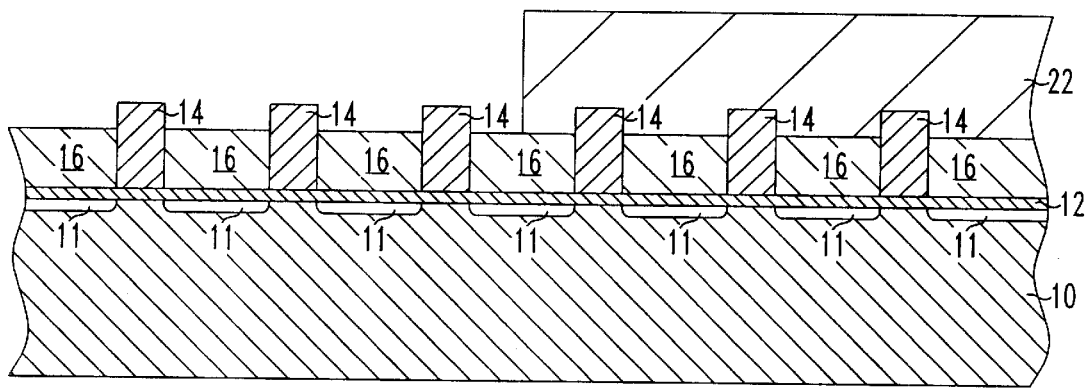

After the unblocked portions of the patterned gate regions have been subjected to ion implantation, first resist 18 and the planarizing organic film are removed from the structure utilizing a conventional stripping process well known in the art, a second organic planarizing film is then formed on the structure and patterned second resist 22 is formed atop the previously ion implanted gate regions providing the structure shown in FIG. 5. The second planarizing organic film may be the same or different as the previous organic film. In the drawings, reference numeral 23 is used for both the second planarizing organic films. The patterned second resist is formed utilizing conventional lithography.

In some embodiments of the present invention, it is possible to remove only the first resist and leave the first planarizing organic film on the structure. This avoids the need of applying a second planarizing organic film to the structure.

Figure 6:
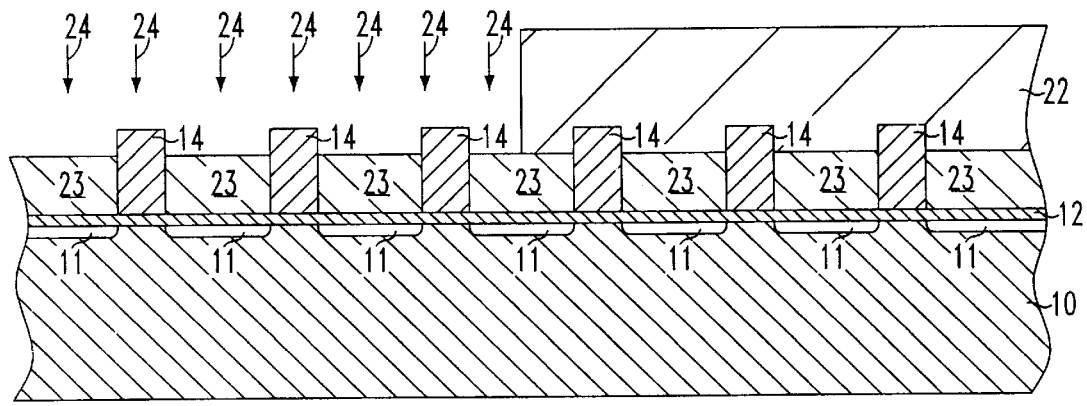

FIG. 6 shows the structure during a second ion implant step (angled or zero angled) wherein second ions (second conductivity type (N or P) or neutral) that are the same or different from the first ions are implanted into the gate region. In a preferred embodiment, different conductivity type ions are employed. Note that reference numeral 24 denotes the second ions that are implanted into the gate region at this point of the present invention. The ion dose used in this implant step may vary, but typically an ion dose of about 5E15 $cm^{-2}$ or greater is employed. A preamorphization step as mentioned above may be employed prior to this implant.

In some embodiments of the present invention, the unblocked planarizing organic film shown in FIG. 6 may be removed and source/drain extension regions and/or source/drain diffusion regions 11, if spacers are present, may be implanted into the surface of substrate 10 as described hereinabove. This embodiment is not shown in the drawings since the source/drain extension and diffusion regions have been previously formed into the surface of substrate 10.

Figure 7:
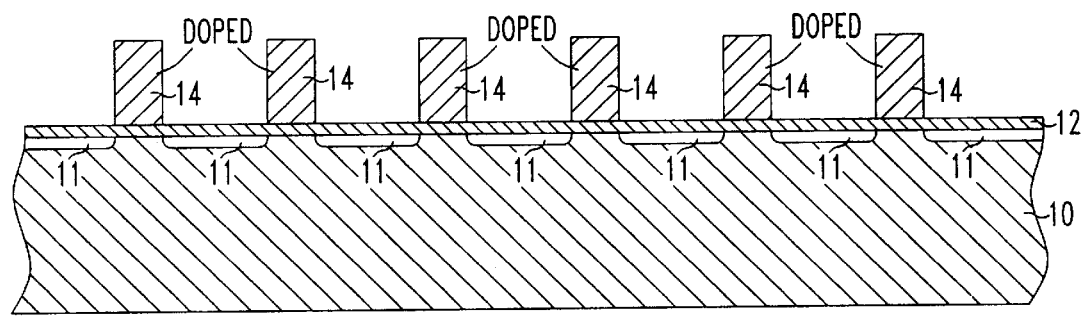

Next, and as shown in FIG. 7, second resist 22 is removed utilizing a conventional stripping process well known in the art and thereafter, and if not previously done, planarizing organic film 23 is removed from the entire structure utilizing a conventional etching process that is highly selective in removing the planarizing organic film. For example, a conventional $O_2$ ashing process or solvent stripping may be employed to completely removed the planarizing organic film from the structure.

It should be noted that after each of the above-mentioned implants, the gate regions may be activated utilizing a conventional activation annealing process that is well known in the art. Note that the gate regions may be annealed separately after implanting each gate region, or the gate regions may be annealed at the same time. Typical annealing conditions that may be used in the present invention for activating the gate regions include an annealing temperature of about 900° C. or greater and an annealing time of about 15 seconds or less. Other annealing times and temperatures can also be employed. The activation annealing step is typically carried out in $N_2$, an inert gas such as He or Ar, or mixtures thereof.

In some embodiments of the present invention, the activation of the gate regions occurs in a single step prior to completely removing planarizing organic film 16 from the structure. In another embodiment of the present invention, the activating of the gate regions may be performed after removing the planarizing organic film from the structure. In such an embodiment, the source/drain diffusion regions and extension implants may be formed after the complete removal of the planarizing organic film, but prior to activating the gate regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a metal oxide semiconductor field effect transistor (MOSFET) device comprising the steps of:
    (a) forming a plurality of patterned gate stacks atop a layer of gate dielectric material;
    (b) forming a first planarizing organic film on said gate dielectric material and abutting vertical sidewalls of said patterned gate stacks, said first planarizing organic film not being present on top, horizontal surfaces of each of said patterned gate stacks;

(c) blocking some of the plurality of patterned gate stacks with a first resist, while leaving other patterned gate stacks of said plurality unblocked;

(d) implanting first ions into said unblocked patterned gate stacks;

(e) removing said first resist and said first planarizing organic film, forming a second planarizing organic film and blocking said previously unblocked patterned gate stacks with a second resist;

(f) implanting second ions into said patterned gate stacks that are not blocked by said second resist; and (g) removing said second resist and said second planarizing organic film.

2. The method of claim 1 wherein step (a) comprising the steps of: forming at least one gate material on said gate dielectric and patterning said gate material via lithography and etching.

3. The method of claim 2 wherein said at least one gate material comprises a conductive material or a material that can be made conductive.

4. The method of claim 2 wherein said at least one gate material is selected from the group consisting of polysilicon, amorphous silicon, an elemental metal or an alloy thereof, a silicide or nitride of an elemental metal and any combination thereof.

5. The method of claim 4 wherein said elemental metal is W, Pt, Pd, Ru, Rh or Ir.

6. The method of claim 2 wherein said at least one gate material is comprised of polysilicon or amorphous silicon.

7. The method of claim 1 wherein said first and second planarizing organic films are formed by a deposition process selected from the group consisting of chemical vapor deposition (CVD), plasma-assisted CVD, evaporation, chemical solution deposition and spin-on coating.

8. The method of claim 1 wherein said first and second planarizing organic films are formed by a combination of spin-on coating and baking.

9. The method of claim 1 wherein said first and second planarizing organic films are comprised of an organic polymer that is not sensitive to UV exposure.

10. The method of claim 1 wherein said first and second planarizing organic films are comprised of an antireflective coating, or polyimide.

11. The method of claim 1 wherein said first resist is formed via lithography.

12. The method of claim 1 wherein said first ions are comprised of a N-type dopant.

13. The method of claim 1 wherein step (d) is performed utilizing an ion dose of about 5E15 $cm^{-2}$ or greater.

14. The method of claim 1 wherein said second resist is formed via lithography.

15. The method of claim 1 wherein said second ions are comprised of a P-type dopant.

16. The method of claim 1 wherein step (f) is performed utilizing an ion dose of about 5E15 $cm^{-2}$ or greater.

17. The method of claim 1 wherein source/drain extension regions and source/drain diffusion regions are formed in a surface of a semiconductor substrate which is present beneath said gate dielectric prior to performing step (b).

18. The method of claim 1 wherein source/drain extension regions and/or source/drain diffusion regions are formed in a surface of a semiconductor substrate which is present beneath said gate dielectric following implant steps (d) and (f).

19. The method of claim 1 wherein source/drain extension regions and/or source/drain diffusion regions are formed in a surface of a semiconductor substrate that is present beneath said gate dielectric after performing step (g).

20. The method of claim 1 wherein said implanted patterned gate stacks are activated after steps (d) or (e) using separate activation annealing steps.

21. The method of claim 1 wherein said implanted patterned gate stacks are activated using a single activation annealing step after said removal of said second resist or after said removal of said planarizing organic film.

22. The method of claim 1 wherein said first and second planarizing organic films are removed using an $O_2$ ashing process or stripping.

23. The method of claim 1 wherein said first planarizing organic film is not removed in step (e) and the second planarizing organic film is omitted.

24. The method of claim 1 wherein said gate dielectric material is patterned and said first planarizing organic film is formed on exposed surfaces of said substrate.

* * * * *